United States Patent [19]
DeMeritt et al.

[11] Patent Number: 5,659,641
[45] Date of Patent: Aug. 19, 1997

[54] OPTICAL CIRCUIT ON PRINTED CIRCUIT BOARD

[75] Inventors: Jeffery A. DeMeritt; Gerald B. Schmidt, both of Painted Post; Robert J. Walker; Paul A. Jakobson, both of Corning, all of N.Y.

[73] Assignee: Corning, Inc., Corning, N.Y.

[21] Appl. No.: 587,774

[22] Filed: Dec. 22, 1995

[51] Int. Cl.[6] ................................................... G02B 6/12
[52] U.S. Cl. ........................... 385/14; 385/137; 385/135
[58] Field of Search ........................... 385/14, 134, 135, 385/136, 137, 138, 139

[56] References Cited

U.S. PATENT DOCUMENTS

| | | | |
|---|---|---|---|
| 4,311,359 | 1/1982 | Keller | 350/96.2 |
| 4,802,727 | 2/1989 | Stanley | 350/96.2 |
| 5,067,785 | 11/1991 | Schirbl et al. | 385/38 |
| 5,295,214 | 3/1994 | Card et al. | 385/92 |
| 5,337,396 | 8/1994 | Chen et al. | 385/92 |
| 5,371,822 | 12/1994 | Horwitz et al. | 385/89 |
| 5,469,526 | 11/1995 | Rawlings | 385/135 |

FOREIGN PATENT DOCUMENTS 6275999 9/1994 Japan.

OTHER PUBLICATIONS

Optical Engineering "Optical waveguide circuit board with a surface-mounted optical receiver array", vol. 33 No. 3, pp. 939–945 (Mar. 1994).

*Primary Examiner*—Phan T. H. Palmer
*Attorney, Agent, or Firm*—Harris Beach & Wilcox, LLP

[57] ABSTRACT

Apparatus for packaging a fiber optic device along with electronic and opto-electronic components upon a printed circuit board. Bend members having arcuate shaped guide surfaces for directing fibers between various components are strategically mounted upon the top surface of the board. Passive fiber optic components are also mounted upon support means between bend members so that the fibers entering and exiting the passive component run tangent to the bend radius of the bend members. The radius of curvature of the bend members is within the bend tolerance of the fibers used in the device. The bend members and support members are formed of a material having a thermal coefficient of expansion that is about equal to that of the board material whereby thermally induced stresses on the board mounted components are minimized.

19 Claims, 3 Drawing Sheets

OPTICAL CIRCUIT ON PRINTED CIRCUIT BOARD

BACKGROUND OF THE INVENTION

This invention relates to apparatus for packaging a wide variety of fiber optic circuit components upon a common support in association with electrical circuit components.

It is conventional to independently package the passive components of a fiber optic circuit on a passive platform. The platform is typically constructed from a single piece of metal. The fiber runs are machined in the platform along with seats for the passive components. In addition, the components on the passive platform are sensitive to damp heat and as a result, the entire unit must be hermetically sealed within a housing or the like. The bottom surface of the housing is equipped with a thermal patch which carries away excessive heat. Passive components housed in the passive platform unit may include, but are not limited to fiber coils, couplers, isolators, filters and fiber coils. The platform is expansion matched to the optical fiber of which these components are assembled.

The passive platform packaging technique, as evidenced by its widespread acceptance, works well in practice, however, it has certain disadvantages which the present invention overcomes. Separating the passive components of the fiber optic circuit from the active components and the electrical circuitry which supports the active components results in an inefficient utilization of space. Also, bringing light carrying fibers in and out of the hermetically sealed platform housing is difficult to achieve and is also expensive. Additional components are also mounted in the housing to monitor environmental conditions to insure that they are within acceptable limits.

Some electrical circuitry used in association with active fiber optic components should be ideally positioned as near as possible to the active component it services. For example, it is well known that a photodetecting monitor used in a fiber optic circuit will exhibit more effective and reliable operational results when mounted in close proximity with supporting circuitry. This type of close compatible mounting cannot be accomplished using a conventional passive platform arrangement.

A fixed passive platform mounted inside a hermetically sealed enclosure furthermore does not afford the flexibility needed to accommodate newly evolving and more innovative opto-electrical architecture. For example, the architecture of some optical devices require that a laser pump be mounted together with passive optical components which, in turn, calls for special considerations for handling waste heat.

Although some devices have been proposed in the literature for integrating optical circuitry and electrical circuitry, none of these devices provide a universal solution to the many problems related to integrating these two types of circuits.

SUMMARY OF THE INVENTION

It is therefore an object of the present invention to improve the packaging of fiber optic circuits.

It is a further object of the present invention to mount both the optical and electrical circuits of a fiber optic device on a common support.

It is a still further object of the present invention to place electrical components for servicing a fiber optic device as near as possible to certain optical components on a common circuit board for enhancing the operation of the device.

Yet a further object of the present invention is to improve the reliability of a photonic device by placing the active and passive components of the device upon a common printed circuit board.

Another object of the present invention is to provide improved packaging for fiber optic devices which saves space and allows for free intermixing of both active and passive fiber optic components upon a common printed circuit board.

Yet another object of the present invention is to provide for greater flexibility in the packaging of new opto-electronic architectures.

BRIEF DESCRIPTION OF THE DRAWINGS

For a better understanding of these and other objects of the present invention, reference will be made herein to the following detailed description of the invention which is to be read in conjunction with the accompanying drawings, wherein.

DESCRIPTION OF THE INVENTION

The present invention will be described with specific reference to a fiber gain block containing an erbium doped fiber coil. It should be evident from the description below, however, that the invention has broader applications and can be employed in conjunction with a wide variety of fiber optic devices utilizing both passive and active optical components. For purposes of this disclosure, passive components include such things as couplers, isolators, filters, gain coils and the like that are self contained and do not require an electrical input to control or support the operation thereof. Active components, on the other hand, include such things as lasers, pump lasers, tunable filters, photodiodes and the like that do require some type of electrical input to sustain operation of the component.

Figure 1:
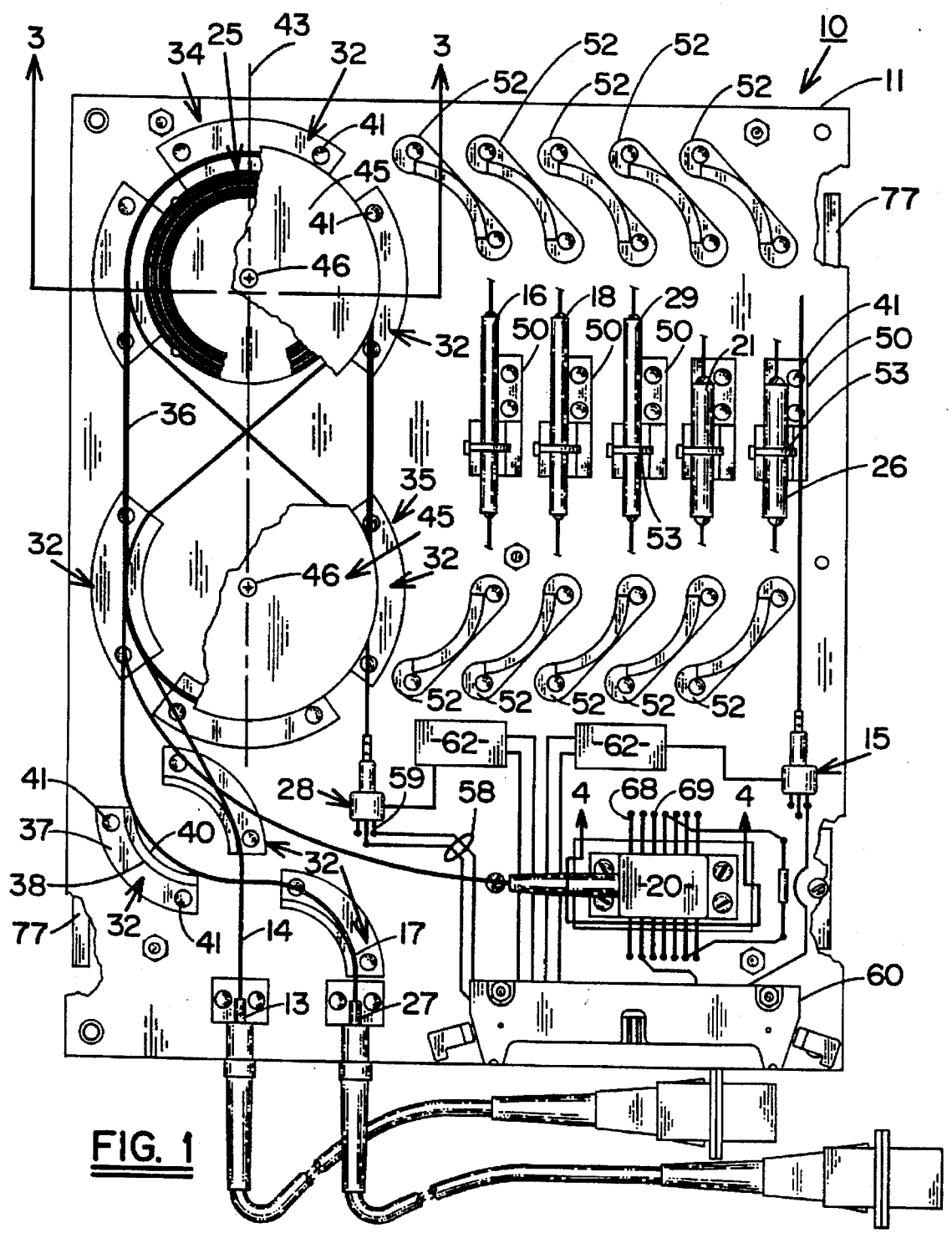
FIG. 1 is a top plan view of a fiber optic device embodying the teachings of the present invention.
Figure 2:
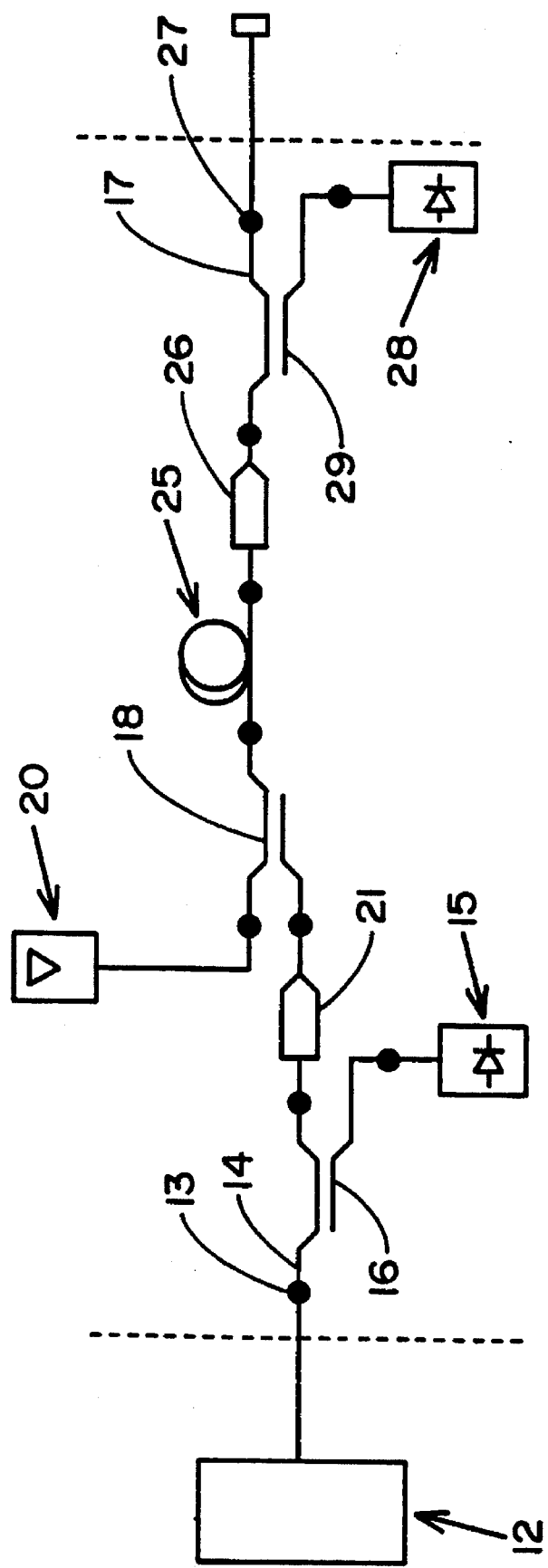
FIG. 2 is an optical schematic of the fiber optic device shown in FIG. 1.

Referring initially to FIGS. 1 and 2, there is shown an optical fiber gain block generally referenced 10 which is mounted upon a printed circuit board 11. The gain block is connected to a pulsed source laser 12 (FIG. 2) at input terminal 13. The source laser provides light energy at a wavelength of 1550 nm to input fiber 14 of the gain block. The pulse input signals are monitored by a photodetecting diode 15 that is optically coupled to the input fiber by means of coupler 16. The pulsed input signal is passed through an isolator 21, and is coupled to a fiber gain coil 25 by coupler 18. The isolator serves as an optical diode to permit transmission of light in one direction only. A pump laser 20 that operates at a frequency of 980 nm is also coupled to the fiber gain coil and its output is combined with the 1550 nm input signal.

The combined 1550 and 980 nm signals are delivered to a fiber coil which function to increase the amplitude of the 1550 nm signal. The coil is a passive device made up of a fiber coil that is doped with erbium. The fiber coil is of sufficient length so that the 980 nm signal from the pump laser is completely attenuated in the coil. The signal leaving the coil is a high gain signal at the original input frequency of 1550 nm which is widely used in optical communication systems.

The output of the gain coil is then passed through a second isolator 26 and out of the gain block through output terminal 27. An output photodetecting diode 28 is connected into the output fiber 17 via a third coupler 29 for monitoring the output of the device.

The present gain block contains six passive components, which are the three couplers, two isolators and a gain coil, and three active components which are the two photodetector diodes and the pump laser. As noted above, the active components of the system each require some type of electrical support to maintain operation. In the case of a photodetecting diode, it is desirable in most applications to place the electrical support circuitry as close as physically possible to the diode to insure efficient operation and reduce the effect on noise. As will become apparent from the disclosure below, by mounting both the active and the passive components of the gain block on a common printed circuit board, the electrical support circuitry for the photodetector diodes can easily be mounted immediately adjacent to the monitoring diodes on the board.

With further reference to FIG. 1, the method by which the components of the gain block are mounted on the circuit board 10 will be explained in greater detail. Light from the source laser is brought into the board at the input terminal 13. As noted above, the amplified 1550 nm signal leaves the gain block via output terminal 27. The input fiber 14 is initially trained over a bend member 32 and then wound about a pair of opposed mandrels generally referenced 34 and 35 to form a fiber racetrack 36.

As is well known, this racetrack arrangement provides a means for accurately aligning and supporting spliced sections of fiber utilized in the gain block. In the present embodiment, each mandrel is established by circumferentially aligning a plurality of bend members at the opposite ends of the racetrack.

Each bend member contains a mounting flange 37 and a raised arcuate shaped guide element 38 that has a fiber contacting guide surface 40 about which optical fibers are trained. The radius of curvature of the guide surface is within the critical bend tolerance of the fibers utilized in the device whereby signal transmission will not be adversely affected nor the fibers physically damaged. The bend members are attached to the board by rivets or integrated snap fasteners 41 that are passed through the mounting flange of the bend member and the underlying board. Each of the guide surfaces of the present bend members transcend an arc of about 90°, however, bend members transcending greater or lesser arcs can be similarly utilized without departing from the teachings of the present invention.

In the case of the present fiber racetrack, each opposed end mandrel is formed by three 90° bend members with the mandrels being centered upon the longitudinal axis 43 of the racetrack. An arcuate shaped cover plate 45 is mounted on top of each mandrel and secured to the board by threaded fasteners 46—46. The diameter of each cover plate is greater than that of the underlying mandrel. The covers thus serve to prevent the fibers wound upon the mandrels from becoming dislodged.

Figure 3:
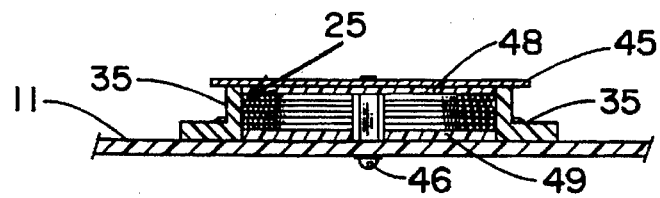
FIG. 3 is an enlarged partial side view in section illustrating an erbium doped fiber coil used in the fiber optic device illustrated in FIG. 1.

With further reference to FIG. 3, the erbium doped coil employed in the present gain block is conveniently mounted within one of the racetrack mandrels. Typically, the coil is fabricated upon a Teflon mandrel and the wound fiber turns are held together by an adhesive applied to the outside of the coil. When the adhesive has set, the coil is removed from the Teflon mandrel.

As can be seen, the wound coil is not a structurally strong component. Special care is taken in the present invention to protect the coil in assembly. As illustrated in FIG. 3, the coil is centered inside one of the racetrack mandrels between two foam pads or discs 48 and 49. The lower pad 48 rests on the top surface of the circuit board while the upper pad rests on the top of the coil. The cover plate 45, when secured in place, compresses the foam pads against the coil, thus holding the coil securely in assembly. Alternatively, the coil may also be glued in place or mechanically trapped in place.

Turning once again to FIG. 1, the three couplers 16, 18 and 29 and two isolators 21 and 26 utilized in the present gain block are all mounted in parallelly aligned support members 50—50. The support members are attached by rivets on the top surface of the circuit board. The couplers and isolators are of conventional construction with each having an elongated body through which a fiber passes. Each support member has a longitudinal groove formed therein that forms a saddle for receiving a component therein. The component, in turn, is secured in the saddle by means of a strap 53 or any other suitable means.

Each support member, in turn, is mounted between two spaced apart bend members 52—52. The opposed bend members are located so that the fiber guide surfaces of the members are both tangent with the center line of a component, mounted in the associated support member. Accordingly, the fiber sections entering and leaving the mounted components are directed by the bend members to other parts of the board without exceeding the bend tolerance of the fiber.

The two photodetector monitor diodes 15 and 28 are also mounted on the top surface of the board as illustrated in FIG. 1 and are electrically coupled to conductive runs 58—58 by leads 59—59. The runs on the board are brought out to a pin connector which is herein referred to as an electrical header 60. The header is mounted along one side margin of the board and is arranged to receive an electrical harness (not shown) that brings electrical power to the board and communicates with remote equipment associated with the various active components.

Also mounted upon the top of the board, in close proximity to each of the monitor diodes, is a single inline package (SIP) 62 containing electrical or opto-electrical elements for servicing adjacent monitors. The SIP units are similarly connected to the electrical header and the associated monitor by appropriate printed runs.

Figure 4:
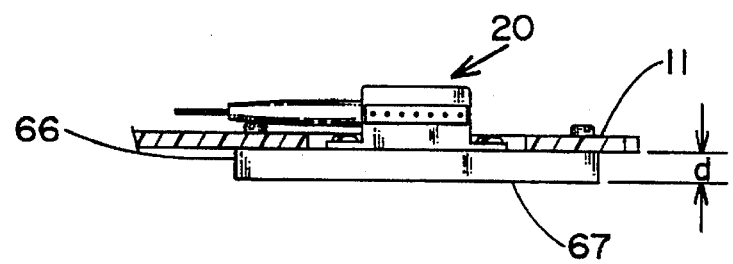
FIG. 4 is an enlarged partial side elevation showing a pump laser mounted on the printed circuit board shown in FIG. 1.

Turning now to FIG. 4, there is illustrated the pump laser unit 20 and means by which the laser unit is mounted in the board 10. The pump laser is mounted within an opening 45 that passes through the board upon a conductive heat sink 66. The heat sink spans the opening and is secured to the lower surface of the board by any suitable means. The bottom surface 67 of the heat sink is parallel with the lower surface of the board and is located a predetermined distance (d) from the board surface. As will be explained below, the flat bottom of the heat sink provides a locating and mounting surface for the board.

As is well known, the pump laser is typically seated upon a thermoelectric cooler which shunts heat away from the laser. In the present embodiment, the cooler presents a hot surface to the heat sink which, in turn, transfers the heat energy efficiently to ambient. Here again, leads 68—68 associated with the pump laser are connected to conductive pads 69 on the board which, in turn, are brought out to the electrical header by suitable electrical runs.

Figure 5:
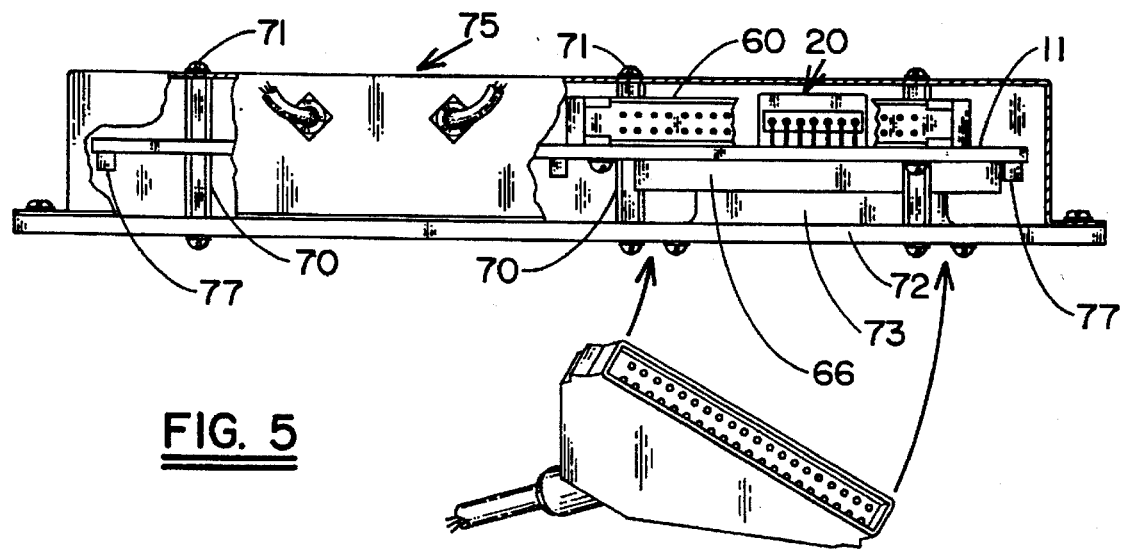
FIG. 5 is a side elevation in section showing the fiber optic device illustrated in FIG. 1 enclosed within a protective housing.

Under certain conditions it may be necessary to mount the gain block within a protective housing. As shown in FIG. 5, the board is easily mounted in a conventional manner upon columns 70—70 by means of screws 71 that pass through the board and are threaded into the column. The columns, in assembly, are mounted on a base or substrate 72. Preferably, the base is provided with a raised boss 73 upon which heat sink 66 associated with the pump laser rests. Because the distance between the lower surface of the bottom surface of the heat sink is closely controlled, the height of the boss section can be accurately located above the base the heat sink rests on the boss and thus help to hold the board in proper alignment in assembly. A protective cover 75 is placed over the board and secured to the base by any suitable fastening device.

Stiffeners 77—77 (FIG. 5) may also be attached to the lower surface of the body which serves to maintain the board in planar alignment and thus resist the tendency of the board to deflect when exposed to either thermal or mechanical stress.

Figure 6:
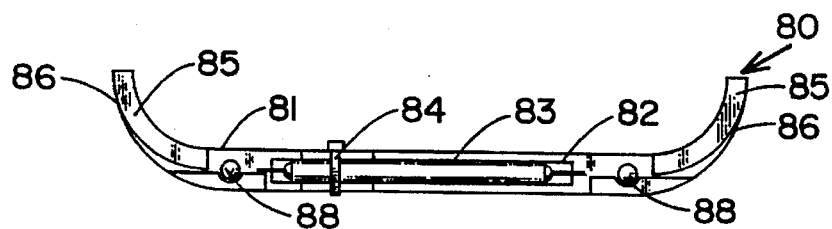
FIG. 6 is a top plan view illustrating a member for a passive optical component that contains a pair of bend sections located at each end of the member.

Although the bend members and the support members were described above as being independent elements the two can be combined as illustrated in FIG. 6 into one integrated structure 80. The integrated structure includes an elongated linear body section 81 having a longitudinally disposed saddle 82 in which a passive optical component 83 is seated. Again, the component is secured in the saddle by means of strap 84. Raised bend elements 85—85 are located at each end of the body section each of which contains an arcuate shaped guide surface 86 for engaging the fiber sections entering and leaving the passive component. The centerline of the saddle runs tangent to the two arcuate guide surfaces whereby the entering and leaving fiber sections are guided around the bends as described above to provide for fiber safety and efficient transmission of the optical signals. The body section of the integrated structure is secured to the board surface by rivets 88—88 or other suitable fasteners. Raised posts 89—89 are also mounted on the body section adjacent to the entrance to the bend section. The posts cooperate with the guide surface to maintain the fiber in proper alignment within the entrance region.

The bend and support members are preferably molded from a plastic material that has about the same coefficient of thermal expansion as the board. The thermal coefficient of expansion of these components are further matched as closely as possible to that of the optical fiber to minimize the effects of thermal stress. By the same token, the stiffeners that are mounted under the board can also be closely expansion matched with the board to further reduce the effects of both mechanical and thermal stress. This, coupled with the heat sink associated with the pump laser further minimizes the effects of thermal changes or the gain block.

While this invention has been explained with reference to the structure disclosed herein, it is not confined to the details set forth and this invention is intended to cover any modifications and changes as may come within the scope of the following claims:

What is claimed is:

1. Apparatus for mounting fiber optic circuits upon a printed circuit board that includes a printed circuit board containing both electrical and optical circuitry on the upper surfaces of said board, bend members each containing an arcuate guide surface having a predetermined radius of curvature that is within the bend tolerance of optical fibers used in said optical circuitry, mounting means for selectively attaching said bend members at predetermined spaced apart locations on the upper surface of the board, support members attached to the upper surface of said board for mounting optical circuit components between spaced apart bend members, a pair of spaced apart mandrels mounted upon the upper surface of said board about which spliced sections of said fiber optic circuitry are wound, each mandrel being formed by a plurality of circumferentially aligned bend members, said bend members and said support members being formed of a material that has a thermal coefficient of expansion that is about equal to that of said optical fibers.

2. The apparatus of claim 1 wherein said optical circuitry include coupler means for optically connecting active optical circuit components that are mounted on said board to said fiber optic circuit and run means on said board for electrically connecting the active component to an electrical header mounted on said board.

3. The apparatus of claim 2 that further includes electrical circuit means mounted on said board for electrically supporting said active optical circuit components.

4. The apparatus of claim 3 wherein at least one of said active components is a photodetector diode and the electrical support circuitry is mounted on said board in close proximity to said photodetector diode to enhance the operation of said diode.

5. The apparatus of claim 1 wherein the thermal coefficient of expansion of said members and said optical fibers are about equal to that of the circuit board.

6. The apparatus of claim 1 wherein said fiber optic circuit includes at least one wound fiber gain coil that is secured to the circuit board between two resilient discs.

7. The apparatus of claim 1 wherein at least one of said support members further include a linear guide surface for directing the entering and exiting optical fibers of the passive component supported therein along a path that is tangential with the guide surfaces of the spaced apart bend members.

8. The apparatus of claim 1 wherein said arcuate shaped guide surfaces of said bend members subtend an arc of about 90° or less.

9. Apparatus for mounting a fiber optic circuit upon a printed circuit board that includes a printed circuit board, bend members each containing an arcuate guide surface having a predetermined radius of curvature that is within the bend tolerance of optical fibers used in the optic circuit, mounting means for selectively attaching the bend members at predetermined spaced apart locations on the upper surface of the board;

support members attached to the upper surface of said board for mounting passive optical circuit components between two spaced apart bend members, said bend members and said support members being formed of a material that has a thermal coefficient of expansion that is about equal to that of said board, wherein said optical circuits include coupler means for optically connecting active optical circuit components that are mounted on said board to said fiber optic circuit and run means on said board for electrically connecting the active component to an electrical header mounted on said board, and a pump laser that is coupled to the fiber optic circuit and the electrical header.

10. The apparatus of claim 9 wherein said board contains an opening that passes through said board, a heat sink mounted upon the lower surface of said board that spans said opening, and means for mounting said laser pump in said opening upon said heat sink.

11. The apparatus of claim 10 wherein the heat sink contains a flat bottom surface that is parallel to the lower surface of said board, said bottom surface of the heat sink being a predetermined distance from the lower surface of said board whereby said bottom surface provides a mounting and locating surface for said board.

12. The apparatus of claim 9 that includes stiffening means attached to said board for resisting both thermal and mechanically induced stresses.

13. The apparatus of claim 9 that includes light input and light output terminals mounted on said board that are connected to said fiber optic circuit.

14. The apparatus of claim 9 that further includes a base for supporting said board and a cover fitted to said base for enclosing said board.

15. Apparatus for mounting a fiber optic circuit upon a printed circuit board that includes a printed circuit board, bend members each containing an arcuate guide surface having a predetermined radius of curvature that is within the bend tolerance of optical fibers used in the optic circuit, wherein said arcuate shaped guide surfaces of said bend members subtend an arc of 90° or less, mounting means for selectively attaching the bend members at predetermined spaced apart locations on the upper surface of the board.

support members attached to the upper surface of said board for mounting passive optical circuit components between two spaced apart bend members, said bend members and said support members being formed of a material that has a thermal coefficient of expansion that is about equal to that of said board, and a pair of spaced apart mandrels mounted upon said board about which spliced sections of the fiber optic circuit are wound, each mandrel being formed by a plurality of circumferentially aligned bend members.

16. The apparatus of claim 15 wherein a wound fiber gain coil is mounted inside at least one of said mandrels.

17. Apparatus for mounting fiber optic circuitry upon a printed circuit board that includes a printed circuit board having a flat planar upper surface containing electrical circuitry thereon, support members attached to the upper surface of the circuit board for mounting optical components containing optical fibers for carrying optical signals into and out of said components, bend members mounted upon the upper surface of said board containing arcuate guide surfaces for physically engaging the optical fibers on the inside of each bend and directing said optical fibers toward and away from said optical components, each guide surface having a radius of curvature that is within the bend tolerance of the optical fibers, and said bend members and said support members being formed of a material that has a thermal coefficient of expansion about equal to that of the optical fibers.

18. The apparatus of claim 17 wherein the thermal coefficient of expansion of said board is about equal to that of the optical fibers.

19. The apparatus of claim 17, that further includes linear guides for further directing said optical fibers toward and away from said optical components along a path that is tangential to the arcuate guide surfaces on the bend members.

* * * * *